(12) United States Patent
Hongoh et al.

(10) Patent No.: US 6,797,111 B2
(45) Date of Patent: Sep. 28, 2004

(54) PLASMA PROCESSING APPARATUS

(75) Inventors: Toshiaki Hongoh, Nirasaki (JP); Tetsu Osawa, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 10/000,312

(22) Filed: Dec. 4, 2001

(65) Prior Publication Data

US 2002/0066536 A1 Jun. 6, 2002

(30) Foreign Application Priority Data

Dec. 4, 2000 (JP) ........................ 2000-369311

(51) Int. Cl.[7] ..................... H05H 1/00; C23C 16/00
(52) U.S. Cl. ..................... 156/345.41; 118/723 MW
(58) Field of Search ................ 156/345.41, 345.42, 156/345.36; 118/723 MW, 723 ME, 723 MR, 723 MA

(56) References Cited

U.S. PATENT DOCUMENTS 5,874,706 A * 2/1999 Ishii et al. ............. 219/121.43
6,325,018 B1 * 12/2001 Hongoh ................. 118/723 AN

FOREIGN PATENT DOCUMENTS

| JP | 3-191073 | 8/1991 | |
|---|---|---|---|
| JP | 5-343334 | 12/1993 | |
| JP | 9-181052 | 7/1997 | |
| JP | 2000299198 A | * 10/2000 | ............ H05H/1/46 |

* cited by examiner

Primary Examiner—Parviz Hassanzadeh
(74) Attorney, Agent, or Firm—Finnegan, Henderson, Farabow, Garrett & Dunner, LLP

(57) ABSTRACT

A plasma processing apparatus includes a process chamber having a ceiling with an opening, a supporting frame member placed along the periphery of the ceiling and including a ring-shaped supporting shelf protruding toward the center of the process chamber, and an insulating plate having its peripheral portion supported by the supporting shelf of the supporting frame member and airtightly covering the opening of the ceiling of the process chamber. The plasma processing apparatus is characterized in that the supporting shelf has an inner periphery which includes a corner portion shaped into a curve.

9 Claims, 4 Drawing Sheets

PLASMA PROCESSING APPARATUS

BACKGROUND OF THE INVENTION

1. Field of the Invention

The present invention relates to a plasma processing apparatus used for processing semiconductor wafers and the like by the action of a plasma generated by microwave.

2. Description of the Background Art

In recent years, semiconductor products have been increased in density and reduced in size to a great degree. Accordingly, some manufacturing processes of the semiconductor products employ a plasma processing apparatus for such processing as film deposition, etching and ashing. In particular, there is a tendency to use a microwave plasma apparatus since the microwave plasma apparatus can produce a plasma in a stable manner even in a high-vacuum state of a relatively low pressure, specifically from about 0.1 to several tens of mTorr, by using the microwave or a combination of the microwave and a magnetic field from a ring-shaped coil to produce a high-density plasma.

Such a plasma processing apparatus is disclosed for example in Japanese Patent Laying-Open Nos. 3-191073 and 5-343334 and Japanese Patent Laying-Open No. 9-181052 filed by the applicant of the present application. A general plasma processing apparatus using the microwave is described briefly below in conjunction with FIGS. 4 and 5. FIG. 4 shows a structure of a conventional and generally employed plasma processing apparatus and FIG. 5 is an enlarged view of a supporting portion for an insulating plate.

Referring to FIG. 4, this plasma processing apparatus 2 includes a process chamber 4 which can be evacuated, a mount base 6 with a semiconductor wafer W mounted thereon is provided in process chamber 4, and an insulating plate 8 is provided in an airtight manner to a ceiling portion opposite to mount base 6. Insulating plate 6 transmitting microwave is formed of aluminum nitride or the like in the shape of a disk, for example. Specifically, referring to FIG. 5, insulating plate 8 is attached in the airtight manner to a supporting shelf 12 via a sealing member 14 such as an O-ring. Supporting shelf 12 protrudes inward in the radial direction from a ring-shaped supporting frame member 10 made of aluminum for example that is provided on the upper end of process chamber 4.

On the upper side of insulating plate 8, there are provided a planar antenna member 16 in the shape of a disk with a thickness of several millimeters and a wave-delay member 18 formed of a dielectric for example for decreasing the wavelength of microwave in the radial direction of planar antenna member 16 as required. In addition, above wave-delay member 18, a ceiling cooling jacket 22 is provided that has a cooling channel 20 formed for flowing a cooling water therein in order to cool wave-delay member 18 and the like. Antenna member 16 includes a great number of microwave radiation holes 24 that are each an almost circular through hole or slit-shaped through hole. An internal cable 28 of a coaxial waveguide 26 is connected to the central part of planar antenna member 16 for guiding a microwave of 2.45 GHz for example produced by a microwave generator (not shown). The microwave is propagated radially in the radial direction of antenna member 16 and also discharged from microwave radiation holes 24 provided in antenna member 16 to be transmitted downward through insulating plate 8 into process chamber 4. The microwave produces a plasma in process chamber 4 for performing a predetermined plasma process such as etching and film deposition for semiconductor wafer W.

Most of the microwave radiated from planar antenna member 16 is supplied into process chamber 4 through insulating plate 8 below antenna member 16. On the other hand, a part of the microwave is propagated within insulating plate 8 in the radial direction thereof. This phenomenon is difficult to avoid.

Here, supporting frame member 10 holding the peripheral portion of insulating plate 8 is grounded and thus has a ground potential. Then, a standing wave 30 (shown diagrammatically in FIG. 5) is generated in insulating plate 8 in the radial direction thereof, the standing wave 30 having its node at the peripheral end of insulating plate 8. Consequently, in the region located slightly apart inward in the radial direction from the peripheral end of insulating plate 8, a high voltage is generated which locally causes an abnormal discharge 32 between the high-voltage region and supporting shelf 12. Abnormal discharge 32 causes the base aluminum which forms supporting shelf 12 to be cut off partially, and any metal other than aluminum that is contained in the base aluminum material could contaminate semiconductor wafer W or cause particle generation. In particular, abnormal discharge 32 described above occurs concentratedly at upper and lower corner portions P1 and P2 on the inner periphery of supporting shelf 12, since an electric field concentrates at angled portions such as upper right-angled corner portion P1 and lower obtuse-angled corner portion P2.

SUMMARY OF THE INVENTION

One object of the present invention is to provide a plasma processing apparatus capable of preventing an abnormal discharge from occurring between the insulating plate and the supporting frame member.

A plasma processing apparatus according to the present invention includes a process chamber having an internal space which can be evacuated and a ceiling with an opening, a supporting frame member placed along the periphery of the ceiling and including a ring-shaped supporting shelf protruding toward the center of the process chamber, an insulating plate having its peripheral portion supported by the supporting shelf of the supporting frame member and airtightly covering the opening of the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave being transmitted through the insulating plate into the process chamber, and a gas supply unit for supplying a predetermined gas into the process chamber. The plasma processing apparatus of the invention is characterized in that the supporting shelf has an inner periphery including a corner portion shaped into a curve.

According to the present invention, the corner portion of the inner periphery of the supporting shelf which supports the insulating plate is curved. Field concentration at this corner is thus alleviated. Consequently, it is possible to prevent discharge from occurring concentratedly at this corner portion.

Preferably, the supporting shelf has the inner periphery including an upper-end corner portion and a lower-end corner portion, and at least one of the upper-end corner portion and the lower-end corner portion is shaped into a curve. More preferably, both of the upper-end corner portion and the lower-end corner portion are shaped into respective curves.

In order to effectively prevent field concentration at the corner portion, the corner portion of the inner periphery of the supporting shelf has a radius of curvature of at least 1 mm. The supporting shelf has a thickness of approximately 20 mm. Therefore, in consideration of this thickness, the corner portion of the inner periphery of the supporting shelf has a radius of curvature of at most 10 mm.

Preferably, the supporting shelf includes a supporting plane facing the insulating plate, and the supporting plane has a sealing groove in which a sealing member is held. For the purpose of avoiding field concentration at the sealing groove, a corner portion of the sealing groove that contacts the supporting plane is preferably shaped into a curve. According to one embodiment, the sealing groove has an inner corner portion and an outer corner portion that contact the supporting plane and the inner corner portion is shaped into a curve. The corner portion of the sealing groove is thus curved so that an abnormal discharge occurring at this corner portion can be avoided.

According to a preferred embodiment, an inner peripheral edge of the supporting shelf is located at a node of microwave propagated in the insulating plate in its radial direction. Then, there is substantially no potential difference between the corner of the inner peripheral edge of the supporting shelf and the insulating plate. Therefore, it is possible to enhance the effect of preventing occurrence of an abnormal discharge at this portion. In order to satisfy this positional relation, for example, the inner peripheral edge of the supporting shelf is apart inward from an outer peripheral edge of the insulating plate by a length equal to one half of wavelength of the microwave propagated in the insulating plate in the radial direction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
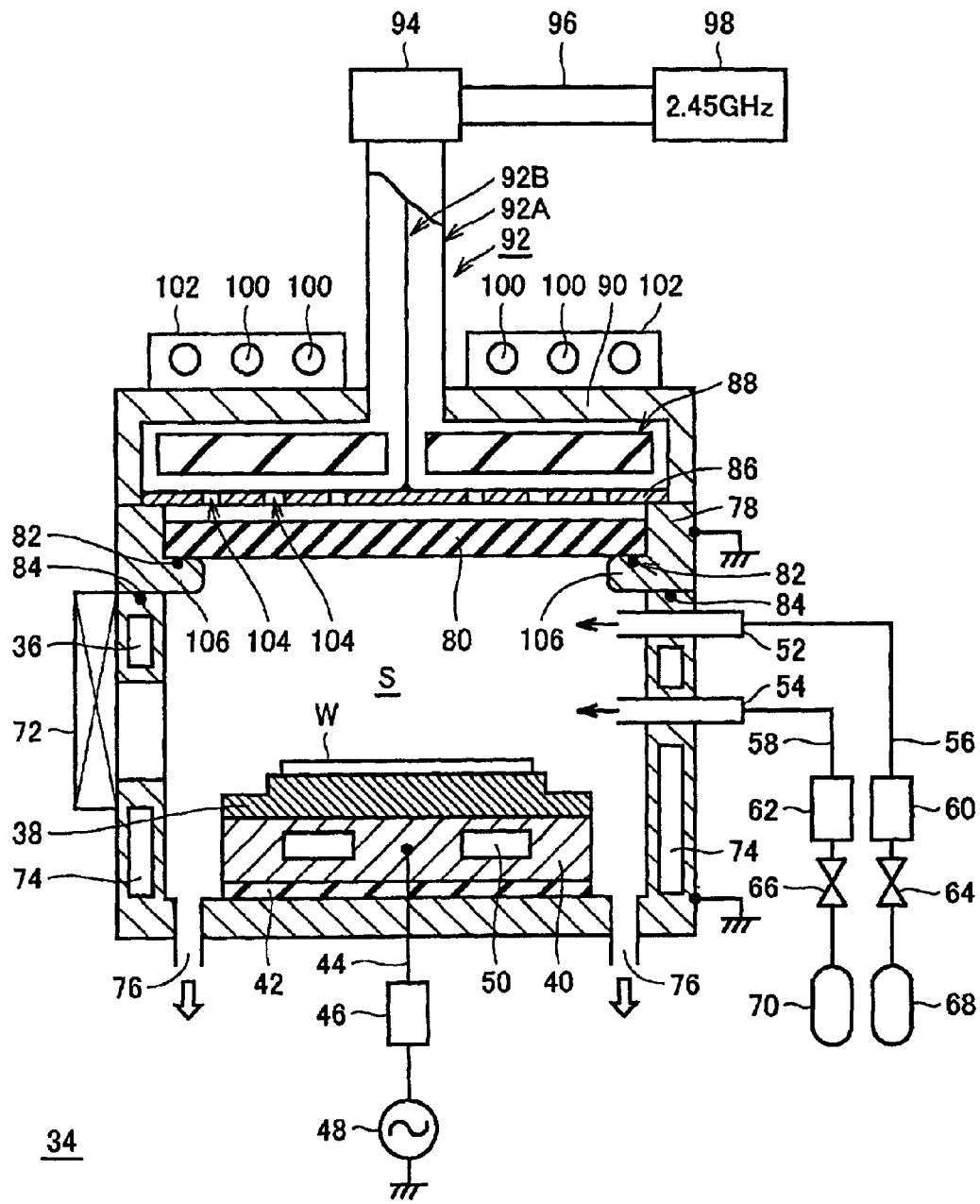
FIG. 1 diagrammatically shows a cross section of a plasma processing apparatus as an example according to one embodiment of the present invention.

A plasma processing apparatus according to one embodiment of the present invention is now described in detail in conjunction with attached drawings.

As shown, this plasma processing apparatus 34 includes a process chamber 36 formed entirely in a tubular shape with its sidewall and bottom formed of a conductor such as aluminum, for example. Process chamber 36 is grounded and the inside thereof is constituted of a sealed process space S.

In process chamber 36, a mount base 38 is housed on which a semiconductor wafer W for example is mounted as a workpiece to be processed. Mount base 38 made of anodized aluminum for example is nearly cylindrical in shape with a flat protrusion. The bottom of mount base 38 is supported by a support base 40 also made of aluminum for example and formed in the shape of a cylinder. Support base 40 is placed within process chamber 36 on the bottom thereof via an insulating member 42.

On the upper side of mount base 38, an electrostatic chuck or clamping mechanism (not shown) is provided for holding a wafer. Mount base 38 is connected by a feeder line 44 to a high-frequency power source 48 for bias of 13.56 MHz via a matching box 46. In some cases, high-frequency bias power source 48 may not be provided.

Support base 40 supporting mount base 38 includes a cooling jacket 50 where a cooling water flows for cooling a wafer being subjected to plasma processing. As required, a heater may be provided in mount base 38.

The sidewall of process chamber 36 is provided with a plasma gas supply nozzle 52 formed of a quartz pipe for supplying a plasma gas such as argon gas for example into the chamber as well as a process gas supply nozzle 54 formed of a quartz pipe for example for supplying a process gas such as deposition gas for example. These nozzles 52 and 54 are connected respectively to a plasma gas source 68 and a process gas source 70 by respective gas supply paths 56 and 58 via mass-flow controllers 60 and 62 and open-close valves 64 and 66. A deposition gas such as $SiH_4$, $O_2$ and $N_2$ for example may be used as the process gas.

Moreover, a gate valve 72 is provided on the sidewall of the chamber that opens and closes when a wafer is transported into or out of the chamber, and a cooling jacket 74 is further provided for cooling the sidewall. An exhaust outlet 76 is provided to the bottom of the chamber that is connected to a vacuum pump (not shown) in order to evacuate the inside of process chamber 36 as required to a predetermined pressure.

Process chamber 36 has an opened ceiling portion. Along the periphery of this opening, a ring-shaped supporting frame member 78 characterizing the present invention is provided via a sealing member 84 such as O-ring. On this supporting frame member 78, an insulating plate 80 is provided in an airtight manner via a sealing member 82 such as O-ring. Insulating plate 80 transmitting microwave is made of dielectric, specifically made of a ceramic material such as AlN for example and has a thickness of approximately 20 mm. A supporting structure is provided by supporting frame member 78 to insulating plate 80 as herein described later.

Above insulating plate 80, a disk-shaped planar antenna member 86 and a wave-delay member 88 having a high-permittivity property are provided. Specifically, planar antenna member 86 is formed to constitute a bottom plate of a waveguide box 90 formed of a hollow cylindrical vessel shaped to be integrated with process chamber 36. Planar antenna member 86 is provided opposite mount base 38 within process chamber 36.

An outer tube 92A of a coaxial waveguide 92 is connected to the center in the upper portion of waveguide box 90, and an internal cable 92B within waveguide 92 is connected to the central part of planar antenna member 86. Coaxial waveguide 92 is connected to a microwave generator 98 of 2.45 GHz for example through a mode converter 94 and a waveguide 96, for transmitting microwave to planar antenna member 86. The frequency is not limited to 2.45 GHz and another frequency, 8.35 GHz for example, may be used. As the waveguide, a waveguide having a circular or rectangular cross section or coaxial waveguide may be employed. According to this embodiment, the coaxial waveguide is used. On the upper side of waveguide box 90, a ceiling cooling jacket 102 is provided having a cooling channel 100 formed therein for flowing a cooling water and accordingly cooling wave-delay member 88 for example. As wave-delay member 88 having the high-permittivity property is provided within waveguide box 90 and on the upper side of planar antenna member 86, the guide wavelength of microwave is decreased by the wavelength-shortening effect of wave-delay member 88. Aluminum nitride for example may be used for wave-delay member 88.

When planar antenna member 86 is applied to an 8-inch wafer, planar antenna member 86 is formed of a disk made of a conductive material with a diameter from 30 to 40 mm and a thickness from 1 to several millimeters, particularly 5 mm for example. Alternatively, planar antenna member 86 is formed of a disk made of a conductive material with a diameter from 300 to 400 mm and a thickness from 1 to several millimeters, particularly 5 mm for example. Specifically, planar antenna member 86 is formed for example of a copper plate or aluminum plate with its surface plated with silver. This disk has a great number of microwave radiation holes 104 formed of through holes each in the shape of a long slit or circle for example. Radiation holes 104 are arranged concentrically or spirally. The outer edge of planar antenna member 86 is connected to waveguide box 90 and grounded.

Figure 2:
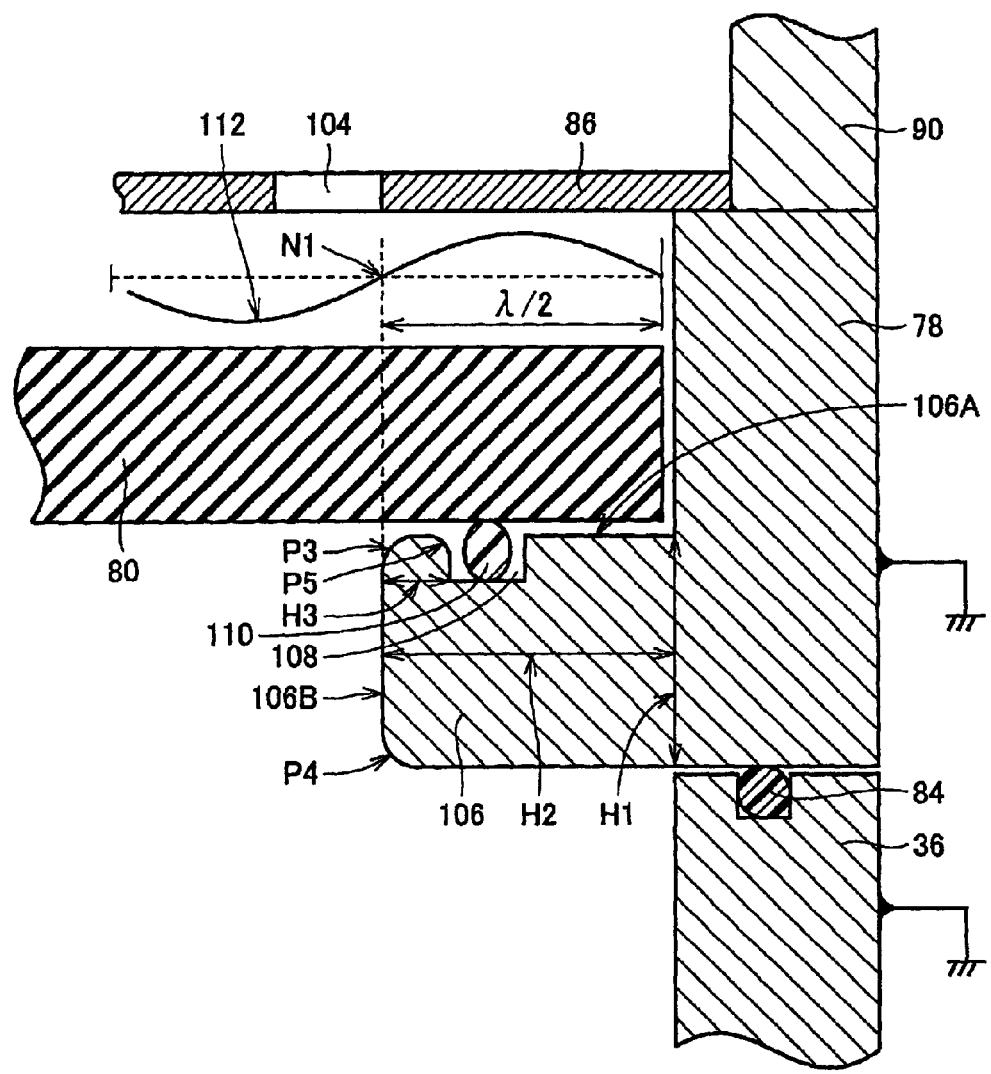
FIG. 2 is a partially enlarged view of the plasma processing apparatus in FIG. 1, showing a region at and near an end of an insulating plate of the plasma processing apparatus.

Supporting frame member 78 which is a component characterizing the present invention is made of aluminum for example in the shape of a ring as described above, and entirely grounded. On the inner periphery of supporting frame member 78, a supporting shelf 106 is provided. Supporting shelf 106 in the shape of a ring or collar protrudes horizontally toward the center of process chamber 36. As shown in FIG. 2, a supporting plane 106A constituting the top surface of supporting shelf 106 has a sealing groove 108 in the shape of a ring with its cross section seemed to be a depression, and this sealing groove 108 extends in the circumferential direction of process chamber 36. A sealing member 110 formed of an O-ring for example is placed within sealing groove 108. With this state maintained, a peripheral portion of insulating plate 80 that is at the lower surface of insulating plate 80 is in contact with and supported on supporting plane 106A. Thus, the opening of the ceiling portion of process chamber 36 is closed in an airtight manner. In particular, according to this embodiment, corner portions P3 and P4 respectively at the upper and lower corners on the inner periphery of supporting shelf 106 are both curved, in order to prevent an electric field from concentrating at the corner portions. Specifically, corner portions P3 and P4 each are preferably shaped into a curve with a radius of curvature of at least 1 mm. In consideration of a thickness H1 of supporting shelf 106, the upper limit of the radius of curvature is approximately 10 mm. According to this embodiment, the radius of curvature of upper corner portion P3 is set at approximately 3 mm and the radius of curvature of lower corner portion P4 is set at approximately 5 mm. Thickness H1 of supporting shelf 106 is set at approximately 20 mm.

Moreover, according to this embodiment, a corner portion P5 of sealing groove 108 is also shaped into a curve, corner portion P5 being located at an upper end on the inner periphery of sealing groove 108 in which sealing member 110 is held, in order to prevent an electric field from concentrating at this corner. The radius of curvature of corner portion P5, which depends on the depth of sealing groove 108, is approximately 1 mm. Here, sealing groove 108 is approximately from 3 to 6 mm in depth and sealing member 110 held within groove 108 is approximately from 3 to 6 mm in diameter.

According to this embodiment, corner portions P3, P4 and P5 are each shaped into a curve. At least one of these corner portions may be shaped into a curve to avoid field concentration at that corner portion and accordingly prevent any abnormal discharge from occurring.

In addition, according to this embodiment, supporting shelf 106 has its inner peripheral edge 106B positioned at a node of a microwave propagated within insulating plate 80 in the radial direction thereof. This microwave propagates as shown diagrammatically in FIG. 2. A standing wave 112 is generated with its node located at the outer peripheral edge of insulating plate 80 which contacts the grounded supporting frame member 78. Inner peripheral edge 106B of supporting shelf 106 is positioned at a distance from the outer peripheral edge of insulating plate 80, and this distance is equal to one half of wavelength λ of the microwave in insulating plate 80. This position corresponds to a node N1 of standing wave 112 described above. In this case, according to the embodiment, the distance from the outer peripheral edge of insulating plate 80 to node N1, in other words, length H2 of supporting shelf 106, is equal to one half of wavelength λ of the microwave of 2.45 GHz which propagates through insulating plate 80 having a dielectric constant of approximately 8.5. Length H2 is thus set at approximately 20 mm. In this way, any potential difference between corner portions P3 to P5 each and insulating plate 80 is reduced as much as possible.

A processing method applied to the plasma processing apparatus structured as explained above is described below.

Semiconductor wafer W is first placed in process chamber 36 by a transport arm (not shown) via gate valve 72, and a lifter bin (not shown) is moved up and down to set wafer W on a mount plane on the upper side of mount base 38.

Then, the inside of process chamber 36 is maintained at a predetermined process pressure, and an argon gas for example is supplied from plasma gas supply nozzle 52 at a controlled flow rate while a deposition gas such as $SiH_4$, $O_2$ and $N_2$ for example is supplied from process gas supply nozzle 54 at a controlled flow rate. Simultaneously, microwave from microwave generator 98 is supplied through waveguide 96 and coaxial waveguide 92 to planar antenna member 86 so as to provide the microwave with the wavelength shortened by wave-delay member 88 into process space S. Plasma is thus generated to carry out a predetermined plasma process, for example, a film deposition process by plasma CVD.

Most of the microwave radiated from planar antenna member 86 is supplied into process space S through insulating plate 80 below antenna member 86. On the other hand, a part of the microwave is propagated within insulating plate 80 in the radial direction thereof. Here, supporting frame member 78 which holds the peripheral portion of insulating plate 80 is grounded and thus has a ground potential. Accordingly, in insulating plate 80, standing wave 112 is generated in the radial direction as shown in FIG. 2, and this standing wave 112 has its node located at the outer peripheral edge of insulating plate 80. In the conventional apparatus, electric field concentration occurs at corner portions of the supporting shelf resulting in an abnormal discharge between the corner portions each and the insulating plate. According to the present invention, corner portions P3, P4 and P5 of supporting shelf 106 are each shaped into a curve with a predetermined radius of curvature. Thus, such a field concentration is suppressed and accordingly alleviated. Consequently, it is possible to prevent such an abnormal discharge from occurring locally between corner portions P3, P4 and P5 each and insulating plate 80.

This effect of preventing the occurrence of an abnormal discharge is achieved most successfully by shaping all of the corner portions P3, P4 and P5 into respective curves. However, a sufficient effect is achieved by shaping corner portions P3 and P5 only, which are at relatively shorter distances from insulating plate 80, into respective curves. Here, the distance H3 between inner peripheral edge 106B of supporting shelf 106 and sealing groove 108 is approximately 5 mm.

According to this embodiment, inner peripheral edge 106B of supporting shelf 106 is substantially at the same position as that of node N1 where the potential of standing wave 112 of the microwave, which is propagated in insulating plate 80, is zero. There is thus a significantly small potential difference between corner portions P3 to P5 each and insulating plate 80, which contributes to a further prevention of the locally occurring abnormal discharge between insulating plate 80 and corner portions P3 to P5 each. In this way, the local abnormal discharge is avoided to prevent sputtering of aluminum of which supporting shelf 106 is made. Accordingly, it is possible to prevent particle generation as well as contamination due to any impurity metal contained therein.

Here, according to this embodiment, insulating plate 80 is made of aluminum nitride. Therefore, one-half wavelength of the propagated microwave, i.e., ½ λ, is approximately 20 mm (correctly 20.9 mm). If alumina is used instead of the aluminum nitride, ½ λ is 18.5 mm. If quartz is employed as a material forming insulating plate 80, ½ λ is approximately 33.5 mm. Length H2 of supporting shelf 106 is accordingly set at the specific value as mentioned above corresponding to any employed material.

Evaluations were conducted by actually using the plasma processing apparatus of the present invention structured as detailed above and processing semiconductor wafers. The number of aluminum atoms present on a surface of a semiconductor wafer was approximately $9 \times 10^9/cm^2$ when the apparatus of the present invention was used, while the number when the conventional apparatus was used was approximately $1 \times 10^{12}/cm^2$. It has accordingly been confirmed that the number of aluminum atoms on the semiconductor wafer surface in the apparatus of the invention is smaller than that in the conventional apparatus by at least two orders and accordingly, sputtering due to an abnormal discharge can remarkably be prevented.

In addition, these apparatuses were disassembled after respective processes and visually observed. Then, a trace of an abnormal discharge which had locally occurred was found in the conventional apparatus while no such a trace was found in the apparatus of the invention, which means that the apparatus of the present invention provides a desirable result.

Figure 3:
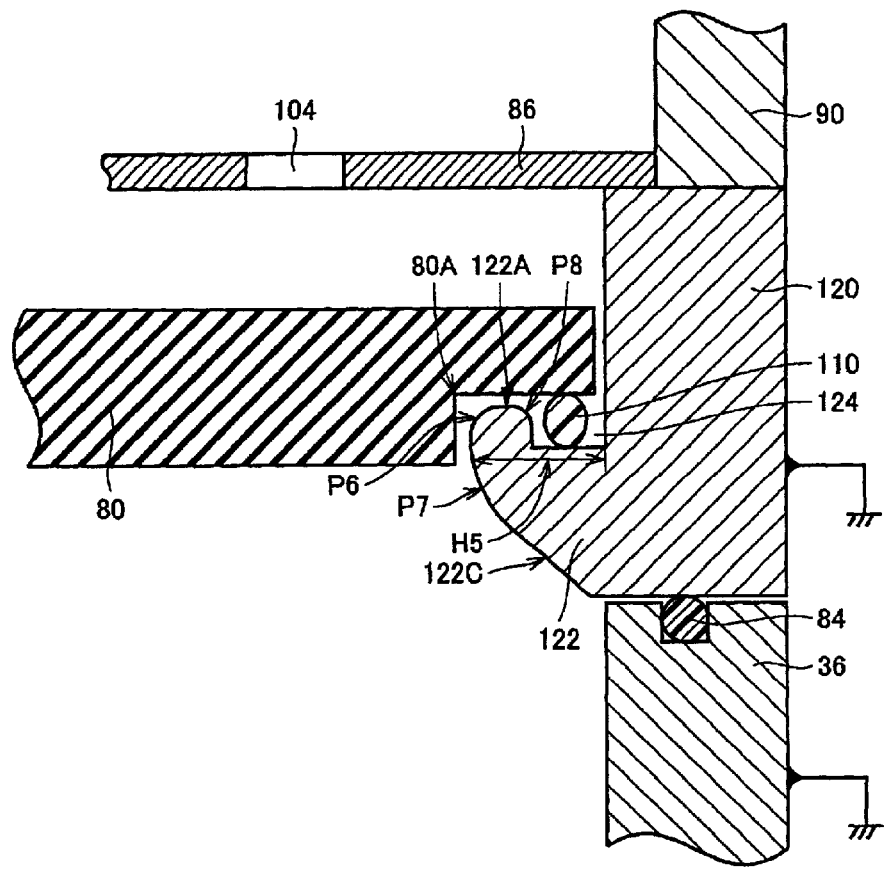
FIG. 3 is a partially enlarged view of a main part of another embodiment of the present invention.
Figure 4:
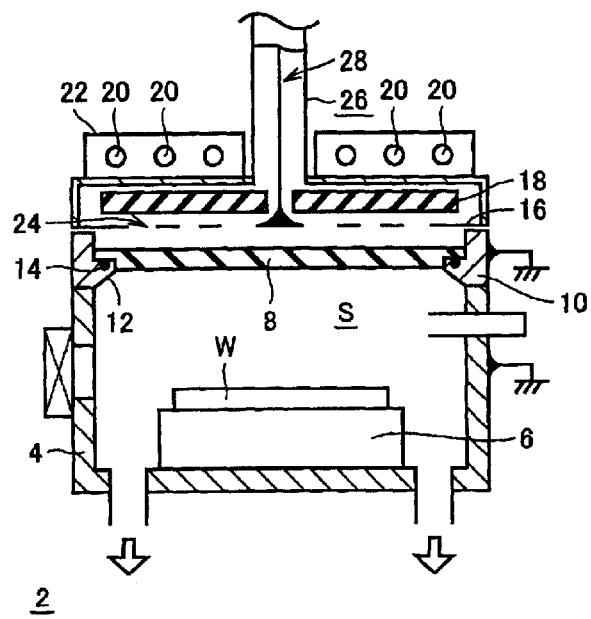
FIG. 4 diagrammatically shows a cross section of a conventional and general plasma processing apparatus.
Figure 5:
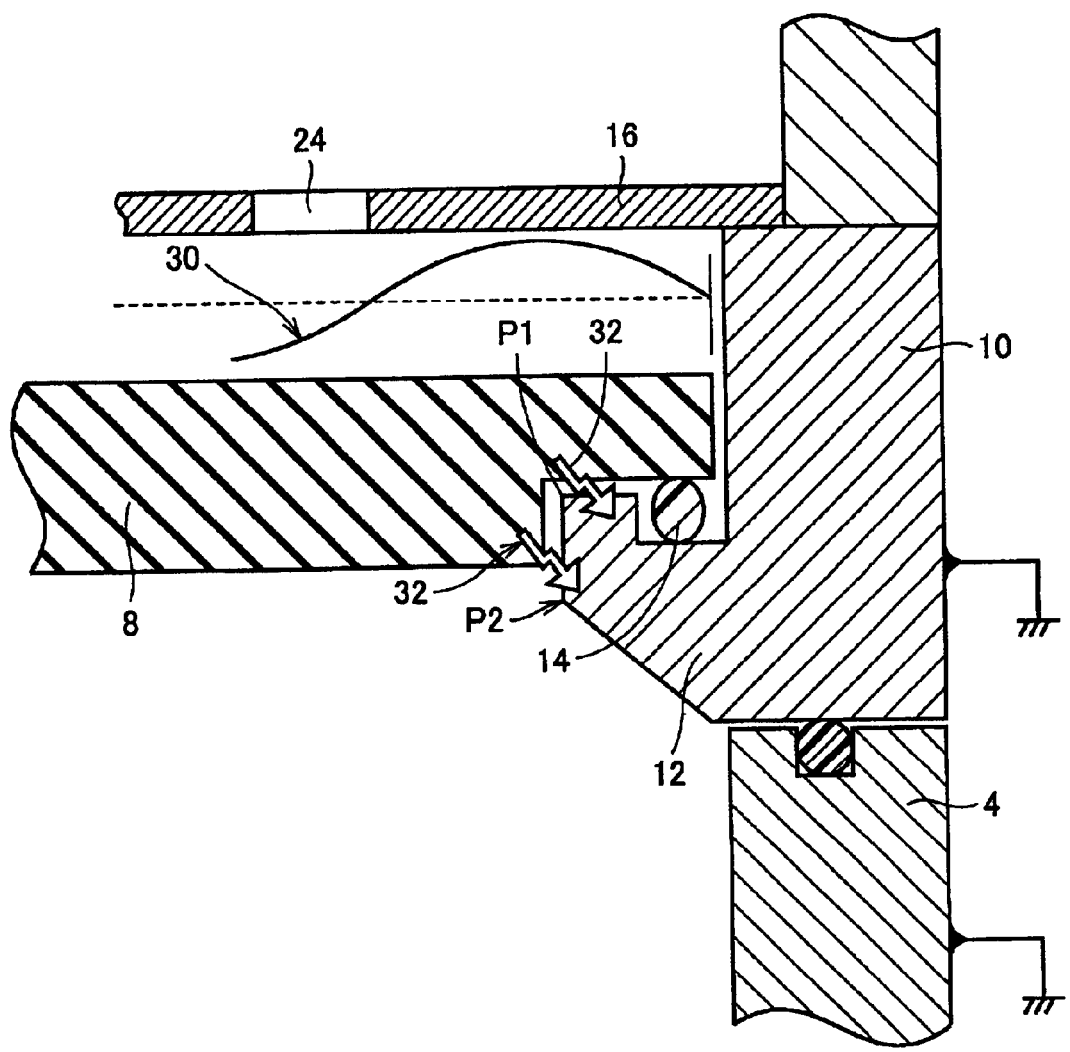
FIG. 5 is a partially enlarged view of the conventional plasma processing apparatus, showing a region at and near an end of an insulating plate of the plasma processing apparatus.

Although supporting frame member 78 of the embodiment described above has its structure considerably different from that of the supporting frame member shown in FIG. 5, this structure is not limited to the specific one described in connection with the embodiment. For example, the corner portions of supporting frame member 78 structured as shown in FIG. 5 may be curved. FIG. 3 is a partially enlarged view of such a modification of the plasma processing apparatus according to the present invention.

Referring to FIG. 3, a supporting frame member 120 is wholly structured in an exactly similar way to that of the frame member shown in FIG. 5, except that the former has curved corner portions. Specifically, this supporting frame member 120 has a supporting shelf 122 protruding toward the center of a process chamber 36, and the bottom surface indicated by 122C of supporting shelf 122 is inclined to form a tapering shape. The top surface of supporting shelf 122 that is a supporting plane indicated by 122A has a sealing groove 124 in the shape of a depression in which a sealing member 110 such as O-ring for example is held.

A peripheral portion of insulating plate 80 has its bottom surface provided with an engagement step 80A. Engagement step 80A is supported hermetically on supporting plane 122A of supporting shelf 122 by being in contact with supporting plane 122A via sealing member 110. Further, corner portions P6, P7 and P8 of supporting shelf 122 are each shaped into a curve as the embodiment described above, in order to prevent electric field concentration at the corner portions.

Supporting shelf 122 has its length H5 in the radial direction of the process chamber that may be the same as the length shown in FIG. 5. However, in order to more perfectly prevent an abnormal discharge from occurring, length H5 is desirably one half of the wavelength of microwave in insulating plate 80. Thus, like the embodiment described above, this modification of the embodiment can avoid field concentration and thus remarkably enhance the effect of preventing occurrence of an abnormal discharge.

The description above of the embodiment of the present invention is applied to the film deposition on a semiconductor wafer. However, the embodiment is not limited thereto and applicable to other plasma processes such as plasma etching and plasma ashing. In addition, the workpiece to be processed is not limited to the semiconductor wafer, and glass substrate, LCD substrate and the like may be employed as a workpiece.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
    a process chamber including an internal space which can be evacuated and a ceiling having an opening;
    a supporting frame member placed along the periphery of said ceiling and including a ring-shaped supporting shelf protruding toward the center of said process chamber;
    an insulating plate having its peripheral portion supported by the supporting shelf of said supporting frame member and airtightly covering the opening of said ceiling of said process chamber;
    a mount base placed in said process chamber for mounting thereon a workpiece to be processed;
    a planar antenna member placed above said insulating plate and including a microwave radiation hole for transmitting therethrough microwave used for generating plasma, said microwave being transmitted through said insulating plate into said process chamber; and
    gas supply means for supplying a predetermined gas into said process chamber, wherein said supporting shelf has an inner periphery including a corner portion shaped into a curve.

2. The plasma processing apparatus according to claim 1, wherein said supporting shelf has the inner periphery including an upper-end corner portion and a lower-end corner portion, and at least one of said upper-end corner portion and said lower-end corner portion is shaped into a curve.

3. The plasma processing apparatus according to claim 1, wherein said supporting shelf has the inner periphery including an upper-end corner portion and a lower-end corner portion, and both of said upper-end corner portion and said lower-end corner portion are shaped into respective curves.

4. The plasma processing apparatus according to claim 1, wherein the corner portion of the inner periphery of said supporting shelf has a radius of curvature of at least 1 mm.

5. The plasma processing apparatus according to claim 4, wherein the corner portion of the inner periphery of said supporting shelf has a radius of curvature of at most 10 mm.

6. The plasma processing apparatus according to claim 1, wherein said supporting shelf includes a supporting plane facing said insulating plate, said supporting plane has a sealing groove in which a sealing member is held, and said sealing groove has a corner portion contacting said supporting plane and the corner portion is shaped into a curve.

7. The plasma processing apparatus according to claim 6, wherein said sealing groove has an inner corner portion and an outer corner portion that contact said supporting plane and said inner corner portion is shaped into a curve.

8. A plasma processing apparatus comprising:

a process chamber including an internal space which can be evacuated and a ceiling having an opening;

a supporting frame member placed along the periphery of said ceiling and including a ring-shaped supporting shelf protruding toward the center of said process chamber;

an insulating plate having its peripheral portion supported by the supporting shelf of said supporting frame member and airtightly covering the opening of said ceiling of said process chamber:

a mount base placed in said process chamber for mounting thereon a workpiece to be processed;

a planar antenna member placed above said insulating plate and including a microwave radiation hole for transmitting therethrough microwave used for generating plasma, said microwave being transmitted through said insulating plate into said process chamber; and gas supply means for supplying a predetermined gas into said process chamber, wherein said supporting shelf has an inner periphery including a corner portion shaped into a curve, wherein an inner peripheral edge of said supporting shelf is located at a node of microwave propagated in said insulating plate in its radial direction.

9. The plasma processing apparatus according to claim 8, wherein the inner peripheral edge of said supporting shelf is apart inward from an outer peripheral edge of said insulating plate by a length equal to one half of wavelength of said microwave propagated in said insulating plate in the radial direction.

* * * * *

UNITED STATES PATENT AND TRADEMARK OFFICE
CERTIFICATE OF CORRECTION

PATENT NO. : 6,797,111 B2
DATED : September 28, 2004
INVENTOR(S) : T. Hongoh et al.

It is certified that error appears in the above-identified patent and that said Letters Patent is hereby corrected as shown below:

Title page,
Item [*] Notice, should read -- Subject to any disclaimer, the term of this patent is extended or adjusted under 35 U.S.C. 154(b) by 236 days --.

Signed and Sealed this

Fourteenth Day of June, 2005

JON W. DUDAS
*Director of the United States Patent and Trademark Office*